US009054142B2

(12) United States Patent
Zhen et al.

(10) Patent No.: US 9,054,142 B2
(45) Date of Patent: Jun. 9, 2015

(54) DATA COLLECTION SYSTEM FOR VACUUM PROCESSING APPARATUS

(75) Inventors: Yugui Zhen, Tokyo (JP); Kiyohisa Katsumata, Hino (JP); Toshiaki Sumitani, Tokyo (JP); Yoshinori Azuma, Tokyo (JP)

(73) Assignee: Canon Anelva Corporation, Kawasaki-shi, Kanagawa (JP)

( * ) Notice: Subject to any disclaimer, the term of this patent is extended or adjusted under 35 U.S.C. 154(b) by 1017 days.

(21) Appl. No.: 13/165,656

(22) Filed: Jun. 21, 2011

(65) Prior Publication Data

US 2011/0313562 A1 Dec. 22, 2011

Related U.S. Application Data

(63) Continuation of application No. PCT/JP2008/073443, filed on Dec. 24, 2008.

(51) Int. Cl.
*H01L 21/67* (2006.01)
*G05B 19/418* (2006.01)
*H01L 21/677* (2006.01)
*H01L 21/66* (2006.01)

(52) U.S. Cl.
CPC .... *H01L 21/67276* (2013.01); *G05B 19/41835* (2013.01); *H01L 21/67745* (2013.01); *H01L 22/20* (2013.01)

(58) Field of Classification Search
USPC ............... 700/108, 117, 121, 217, 247, 250; 702/81, 182, 187; 370/242, 412; 340/539.12
See application file for complete search history.

(56) References Cited

U.S. PATENT DOCUMENTS

| 4,151,590 | A  | * | 4/1979  | Azegami .......................... 700/2 |
| 5,663,884 | A  | * | 9/1997  | Nishihata et al. ............. 700/121 |
| 6,002,996 | A  | * | 12/1999 | Burks et al. ................... 702/188 |
| 6,301,514 | B1 | * | 10/2001 | Canada et al. ................ 700/108 |
| 6,395,094 | B1 | * | 5/2002  | Tanaka et al. ................. 118/719 |
| 7,197,370 | B1 | * | 3/2007  | Ryskoski ...................... 700/108 |
| 7,738,859 | B2 | * | 6/2010  | Roy et al. .................. 455/414.1 |
| 8,054,752 | B2 | * | 11/2011 | Druke et al. .................. 370/242 |

(Continued)

FOREIGN PATENT DOCUMENTS

| JP | 2002110495 A | 4/2002 |
| JP | 2005276935 A | 10/2005 |

(Continued)

OTHER PUBLICATIONS

PCT International Search Report in corresponding International Application No. PCT/JP2008/073443, dated Feb. 10, 2009.

(Continued)

*Primary Examiner* — Darrin Dunn
(74) *Attorney, Agent, or Firm* — Fitzpatrick, Cella, Harper & Scinto (57) ABSTRACT

A control device of a transfer module and a process module in a vacuum processing apparatus collects state data from the modules. The control device has a state data set including data on the entire module, updates its own state data in the set of its own state data acquired at acquisition timing and transmits it to a data collection device at transmission timing. A plurality of control devices is connected in a loop or in a chain to the data collection device; a data transmission interval is shorter than a data collection interval, and entire transmission synchronization is set to be less than twice an interval of acquisition timing.

6 Claims, 6 Drawing Sheets

(56) References Cited

U.S. PATENT DOCUMENTS

| | | | |
|---|---|---|---|
| 8,386,661 B2 * | 2/2013 | Ostrovsky et al. | 710/15 |
| 2003/0115369 A1 * | 6/2003 | Walter et al. | 709/253 |
| 2004/0105737 A1 * | 6/2004 | Ozawa et al. | 414/217 |
| 2004/0176868 A1 * | 9/2004 | Haga et al. | 700/121 |
| 2004/0230341 A1 * | 11/2004 | Suh et al. | 700/264 |
| 2005/0083209 A1 * | 4/2005 | Miyamae et al. | 340/854.9 |
| 2006/0064440 A1 * | 3/2006 | Perry | 707/200 |
| 2006/0235563 A1 * | 10/2006 | Parikh et al. | 700/121 |
| 2006/0246683 A1 * | 11/2006 | Pan et al. | 438/424 |
| 2007/0078527 A1 * | 4/2007 | Gonzalez-Banos et al. | 700/19 |
| 2009/0012633 A1 * | 1/2009 | Liu et al. | 700/90 |
| 2009/0119267 A1 * | 5/2009 | Jung et al. | 707/3 |
| 2009/0125276 A1 * | 5/2009 | Koizumi | 702/182 |
| 2009/0138118 A1 | 5/2009 | Inokawa et al. | |
| 2009/0226294 A1 | 9/2009 | Sekido et al. | |
| 2009/0228129 A1 * | 9/2009 | Moyne et al. | 700/102 |

FOREIGN PATENT DOCUMENTS

| | | |
|---|---|---|
| JP | 2007129177 A | 5/2007 |
| JP | 2007305632 A | 11/2007 |

OTHER PUBLICATIONS

Written Opinion of the International Searching Authority in corresponding International Application No. PCT/JP2008/073443, dated Feb. 10, 2009.

International Preliminary Report on Patentability dated Nov. 18, 2010, issued in corresponding PCT Application No. PCT/JP2008/073443.

\* cited by examiner

DATA COLLECTION SYSTEM FOR VACUUM PROCESSING APPARATUS

CROSS-REFERENCES TO RELATED APPLICATIONS

This application is a continuation application of International Application No. PCT/JP2008/073443, filed Dec. 24, 2008, the entire contents of which are incorporated herein by reference.

BACKGROUND ART

A vacuum processing apparatus for manufacturing a semiconductor device, an electronic part or the like has a chamber that can exhaust its interior and includes: at least one process module for performing processing on an object to be processed under vacuum; and a transfer module for supplying the object to be processed to the process module. Conventionally, a data collection server is connected to these modules, and thus state data of the process module and the transfer module is constantly collected. The collected state data is used for monitoring the operational condition of the device and analyzing the cause of a failure when the failure occurs (see patent document 1).

The data collection is commonly performed as follows: the data collection server requires the process module or the transfer module to perform transmission by socket communication in accordance with the period of the data collection, and, in response to this requirement, the process module or the transfer module transmits the state data.

[Patent document 1] Japanese Patent Application Laid-Open Publication No. 2005-276935

SUMMARY OF INVENTION

However, when the number of connection modules is increased, the timing of data transmission requirement to the first response station and the timing of data transmission requirement to the last response station considerably differ from each other.

This is because one module is required to transmit data, then the data is received from the module and thereafter the subsequent module is required to transmit data on a one by one basis.

When the timing of the transmission requirement differs as described above, since the module transmits present values at the time of reception of the transmission requirement to the data collection device, the time of sampling of the state data collected by the data collection device in each module is also different. A network is generally configured so as to prevent this difference from causing a problem. However, for example, when the data collection device is congested, depending on the load condition of the data collection device, this difference may be increased too much to be ignored, and thereby the result that the reliability of the data collection is disadvantageously reduced occurs.

A vacuum processing apparatus according to the present invention includes:
a transfer module control device that acquires state data of the transfer module at first timing and transmits data including the state data;
a process module that is connected to the transfer module and performs processing on the object to be processed which is transferred from the transfer module;
a process module control device that acquires state data of the process module at second timing and transmits data including the state data; and
a data collection device that collects the state data of the transfer module and the process module,
wherein at least one of the transfer module control device and the process module control device receives data including the state data from the other, and one of the transfer module and the process module updates, in response to timing of reception, its own state data with state data acquired by itself at that time and transmits a state data set including state data of the other to the data collection device.

The transfer module control device, the process module control device and the data collection device are connected in a loop or in a chain and are configured such that a state data set including the state data of the transfer module and the process module can be transmitted and received, and the transfer module control device and the process module control device update a state data portion, acquired by the devices, of the received state data set.

A transmission period of the state data set of each of the process module control device and the transfer module control device is set such that an arrival time until the state data portion updated in the process module control device and the transfer module control device arrives at the data collection device is less than twice a data collection interval in the data collection device.

The process module control device and the transfer module control device are configured such that processing for acquiring the state data and processing for transmitting data including the state data can be performed concurrently.

A history storage device that stores a history of state data acquired by the data collection device is further provided.

According to the present invention, even when congestion occurs in one of devices on a network, a possibility that the overall transmission time of state data is significantly fluctuated is extremely low.

DESCRIPTION OF EMBODIMENTS

Figure 1:
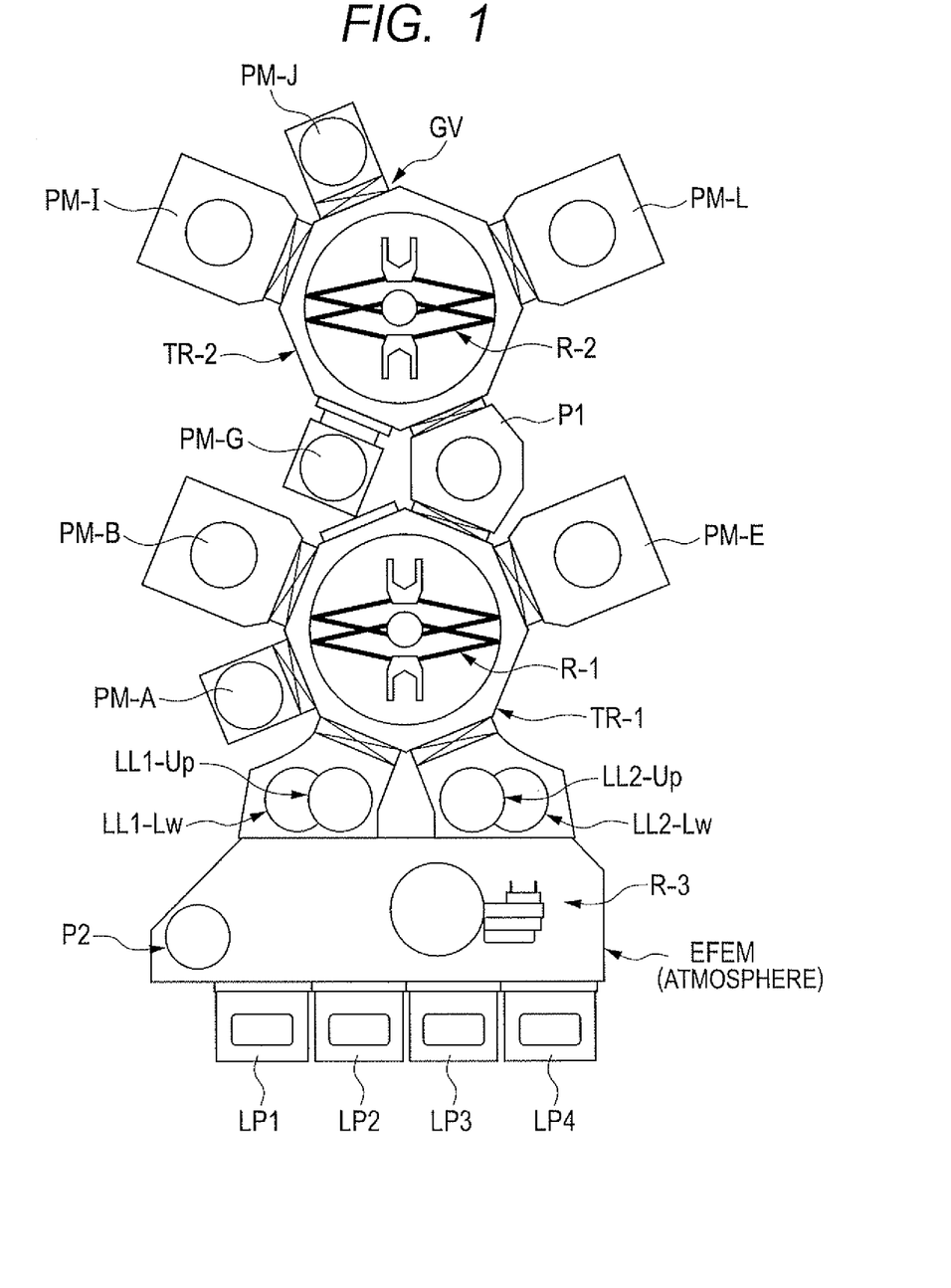
FIG. 1 is a diagram showing the configuration of a vacuum processing apparatus according to an embodiment of the present invention.

In a vacuum processing apparatus of FIG. 1, transfer chambers Tr-1 and Tr-2 respectively have transfer robots R-1 and R-2 that can transfer an object to be processed (such as a substrate). The transfer chambers Tr-1 and Tr-2 are connected to exhaust means such as an unillustrated vacuum pump, and can be exhausted under vacuum. The vacuum processing apparatus is used for manufacturing a semiconductor memory, a magnetic memory such as a MRAM or an electronic part such as an LED.

Load lock chambers LL1 and LL2 are connected to the transfer chamber Tr-1. Each of the load lock chambers LL1 and LL2 has an upper and lower two stage structure (upper and lower), accommodates one wafer and can independently generate an atmospheric state or a vacuum state. The atmospheric state and the vacuum state are switched, and thus the wafer is fed out and in from the robot of an EFEM (equipment front end module) under the atmosphere. The load lock chamber LL1 is used only for loading; the load lock chamber LL2 is used only for unloading. Process modules PM-A, PM-B and PM-E are connected to the transfer chamber Tr-1. An aligner P1 is attached between the transfer chamber Tr-1 and the transfer chamber Tr-2. The aligner P1 moves the wafer between the transfer chambers Tr-1 and Tr-2 and corrects the position of the wafer. Process modules PM-I, PM-J and PM-L are connected to the transfer chamber Tr-2. The EFEM is provided with a robot R-3 and an aligner P2; the wafer is transferred between inside a cassette carrier on load ports (LP1 to LP4) and inside the load lock chamber. In the apparatus shown in FIG. 1, an assembly formed with the transfer chambers Tr-1 and Tr-2, the EFEM, the aligner P1 and the load lock chambers LL1 and LL2 is a transfer module TM.

Figure 6:
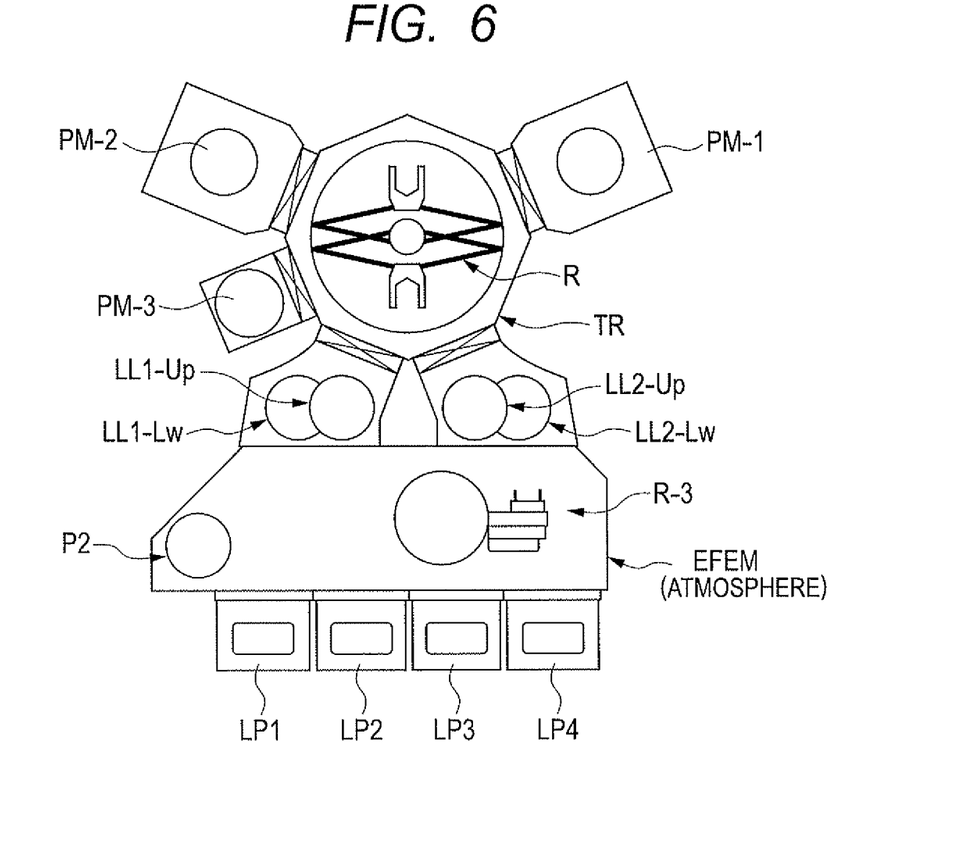
FIG. 6 is a diagram showing an example of the configuration of a vacuum processing apparatus incorporating one transfer chamber.

The vacuum processing apparatus to which the present invention can be applied is not limited to the example shown in FIG. 1; for example, as shown in FIG. 6, it may be a vacuum processing apparatus that has one transfer chamber Tr or the one having three or more transfer chambers Tr. The number of process modules is not limited. The process modules include, for example, the one for deposition that performs deposition by spattering or CVD, the one for dry etching such as plasma etching and the one for heating an object to be processed in order to discharge gas or perform temperature adjustment.

Figure 2:
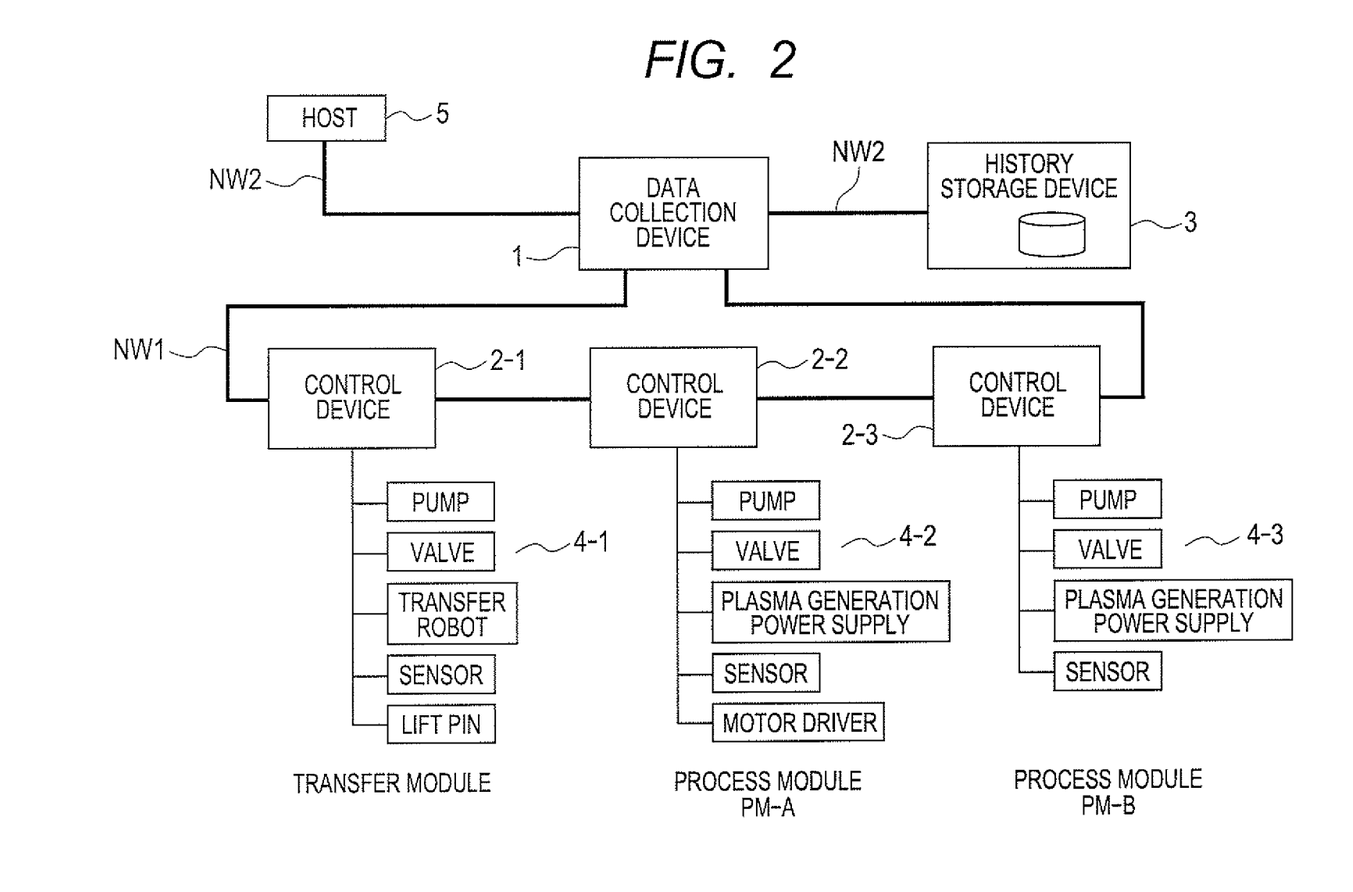
FIG. 2 is a diagram showing the configuration of a control system including a control device and a data collection device.

FIG. 2 shows the configuration of a control system in the vacuum processing apparatus. The vacuum processing apparatus includes: a control device 2-1 that controls the transfer module; a control device 2-2 that controls the process module PM-A; a control device 2-3 that controls the process module PM-B; and a data collection device 1 that collects state data of the process modules and the transfer module from these control devices 2-1 to 2-3.

These control devices 2-1 to 2-3 and the data collection device 1 are connected in a loop to each other through a network NW1. To the network NW1, for example, a loop connection (communication rate of, for example, 10 Mbps or 25 Mbps) using an optical fiber or a coaxial cable can be applied; for example, a network system such as "MELSEC-NET/H" (made by Mitsubishi Electric Corporation) can be used.

In FIG. 1, as the process modules, PM-A, PM-B, PM-E, PM-G, PM-I, PM-J and PM-L are shown. Here, although, for ease of description, only the process modules PM-A and PM-B are shown, the process modules PM-E, PM-G, PM-I, PM-J and PM-L other than those are also connected in a loop to the same network NW1.

The vacuum processing apparatus includes: a host that provides an instruction to the control devices 2-1 to 2-3 at a predetermined timing and makes them perform processing according to a procedure (recipe) of processing the substrate; and a history storage device 3 that acquires the state data collected by the data collection device 1 and stores its history; these are connected to the data collection device 1 through a network NW2. The type of network NW2 is not limited; for example, a connection standard such as LAN or RS-232C can be applied. The host also has the function of outputting an instruction to collect data to the data collection device 1.

Figure 3:
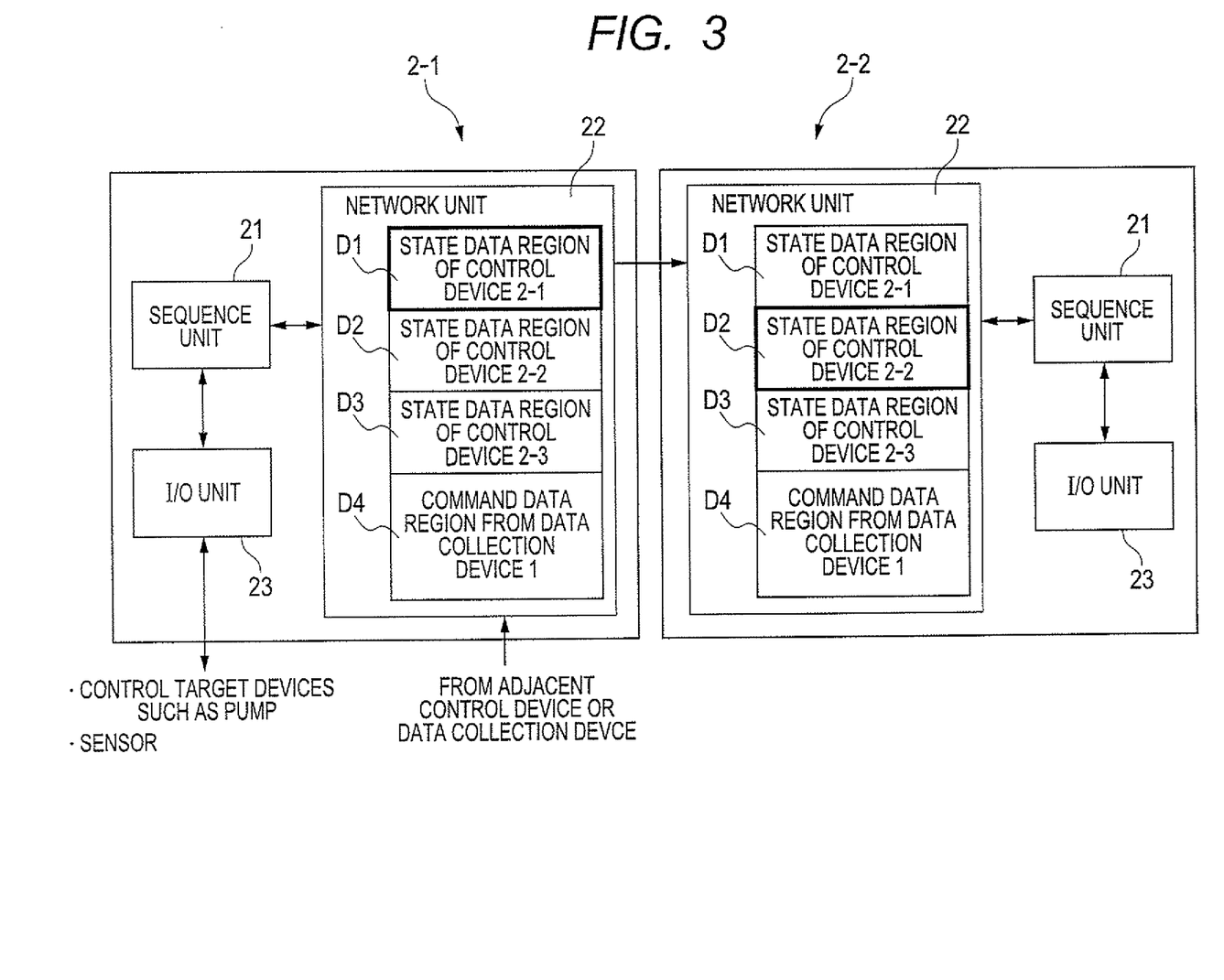
FIG. 3 is a diagram showing the configuration of the control device.

FIG. 3 is a functional block diagram of the control device 2.

In the present embodiment, the control device 1 is configured with a PLC (programmable logic controller), and includes a sequence unit 21, a network unit 22 and an I/O unit 23.

The sequence unit 21 outputs an operation instruction to a control target device such as the process module or the transfer module according to an instruction from the host or a predetermined sequence. The sequence unit 21 also acquires an output value that indicates the state of the control target device and that is received from the control target device and an output value of each sensor at a predetermined acquisition timing, and outputs, to the network unit 22, the state data that is to be collected by the data collection device 1. In the present embodiment, these operations are achieved by repeatedly performing a predetermined sequence program (for example, every several milliseconds).

For example, the control target devices include: a gate valve GV that divides between the process module PM and the transfer chamber TR as shown in FIG. 1; a mass flow controller for introducing reactive gas and discharge gas; various types of valves such as an exhaust valve; a pump for evacuating the chamber of each process module; a power supply for generation of plasma; a lift pin for moving the substrate up and down from a substrate placement stage; and the transfer robot R in the case of the transfer module TM. The sensors include: a temperature sensor for detecting the temperature of the substrate and the temperature of the interior of the chamber; and a pressure sensor for detecting the pressure of the chamber.

The method of configuring the control device is not limited to the method described above; for example, a plurality of process modules may be controlled by one control device, or the transfer module may be divided for each chamber and the control device may be provided for each divided module. However, as in the present embodiment, even when each process module is provided with a preceding stage device for supplying the substrate to a plurality of transfer chambers and transfer robots, the transfer module involved in the transfer of the substrate is provided with a single control device, and thus it is possible to enhance the expandability of the device.

The network unit 22 has the function that by transmitting and receiving the state data between the network unit 22 and the adjacent data collection device 1 or the control device 2, the network unit 22 transmit the state data to the data collection device 1. In the present embodiment, the network unit 22 includes a computation processing device independent of the sequence unit 21, thereby can perform the processing concurrently along with the processing performed by the sequence unit 21, and repeatedly performs data communication with the adjacent device at intervals of transmission and reception asynchronous with execution intervals of the sequence program of the sequence unit 21. In the present embodiment, the network unit 22 repeatedly performs transmission and reception processing at intervals (transmission timing) shorter than the execution intervals (acquisition timing) of the sequence program for acquiring the state data.

Figure 4:
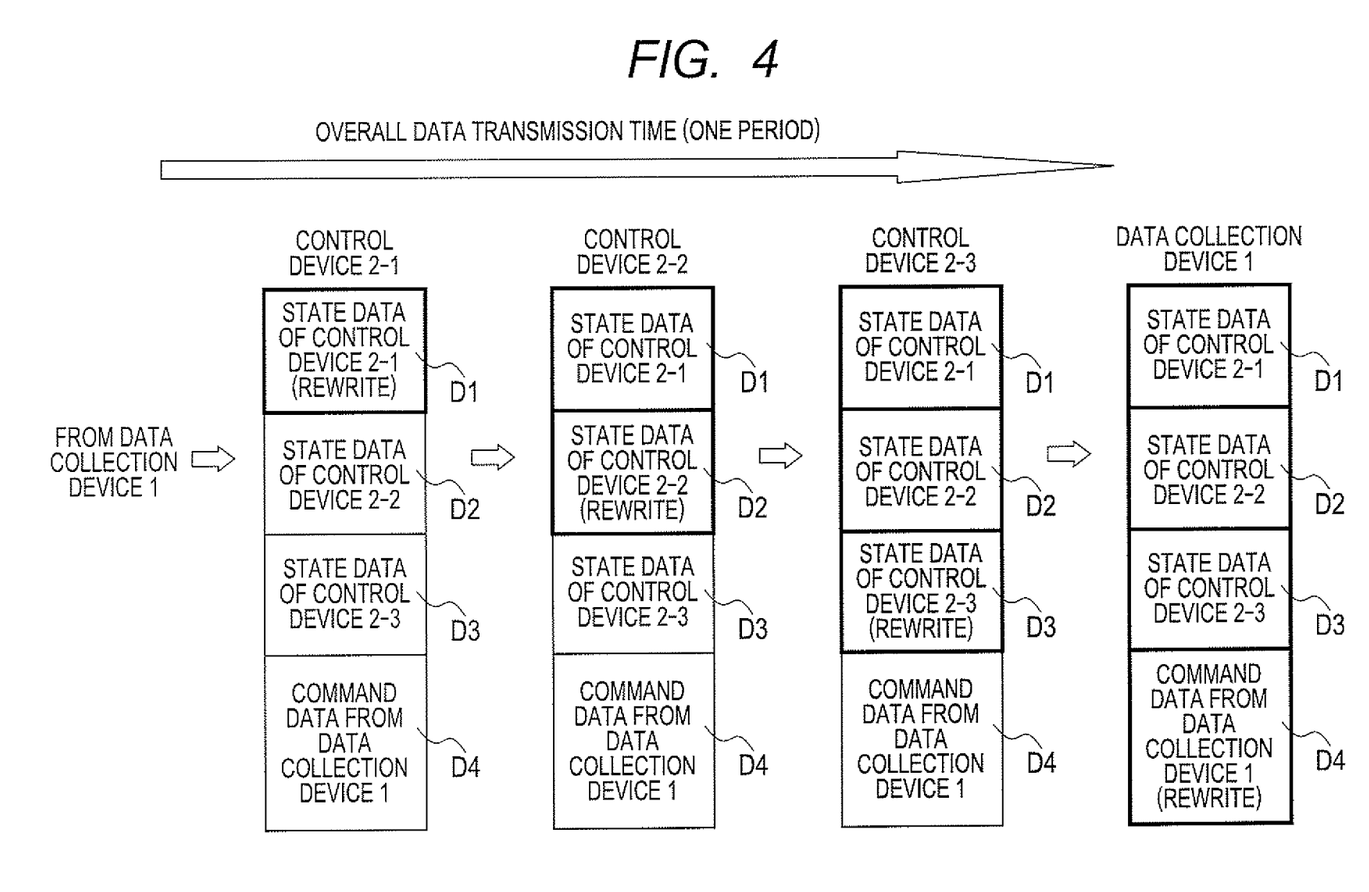
FIG. 4 is a diagram showing the flow of data between the control devices.

Specifically, as shown in FIG. 4, the network unit 22 can hold the state data of a module to be controlled by itself, the state data of all the control devices 2 connecting to the same network and state data sets D1 to D4 including command data transmitted from the data collection device 1. Among them, only the state data of the module to be controlled by itself can be updated by its own sequence unit 21; as to the state data in the other storage regions, data received from the other control devices 2 is held as it is, and used by being referenced by the sequence unit 21 or the like. As described above, the operation of updating the data by the sequence unit 21 is performed at the execution interval (the first and second timing) of the sequence program, and the updated state data sets are transmitted to the adjacent control device 2 at the subsequent transmission timing after the updating of the data.

The command data included in the state data sets include command data on the data collection transmitted from the data collection device 1 and commands on a procedure of performing processing on the substrate transmitted from the host through the data collection device 1. The command data on the data collection includes, for example, data that specifies the addition, the deletion and the change of data collection items and the change of the period of acquisition of some data collection items.

The I/O unit 23 has the function of communicating with the control target devices and the sensors. FIG. 4 shows a diagram illustrating the flow of transmission and reception of the state data among the control devices 2-1 to 2-3 and between the control device and the data collection device 1.

Each of the control devices 2-1 to 2-3 and the data collection device 1 receive the state data set from the adjacent control device or the data collection device 1, and transmits the state data set currently held in the memory to the other adjacent control device or the data collection device 1 at a predetermined transmission timing. In other words, basically, the state data set is transmitted by one-way communication within a loop. As described above, when the state data held in each of the control devices 2 is updated according to the period of acquisition of the state data through its own sequence unit 21, the state data set including the updated latest state data is transmitted to the adjacent control device 2 at the subsequent transmission timing by the network unit 22. As described above, the state data acquisition processing performed by each of the control devices 2 and the data collection device 1, the state data update processing and the state data transmission and reception processing are performed at execution intervals of the predetermined sequence program or at the intervals of the transmission and reception by the network unit regardless of whether or not the state data is updated.

FIG. 4 shows how, in the loop communication described above, as time elapses from the left side of the plane of the figure to the right side of the plane of the figure, each of state data portions of the state data set is sequentially updated. In the present embodiment, in the one-way loop, the period when the latest data of the control device 2 farthest away from the data collection device 1 is transmitted to the data collection device 1 is regarded as the overall period of the transmission of the state data, and the communication rate of the network NW1, the period of the transmission and reception through the network unit 22 and the loop configuration are set such that the overall period of the transmission is shorter than the period of collective data collection in the data collection device 1. Preferably, the transmission timing is set such that the overall transmission period is less than twice the state data acquisition period (internal of acquisition timing) of each of the control devices 2, and thus the acquisition timings of the state data within the state data set can be made equal to each other or different from each other one time at most.

Figure 5:
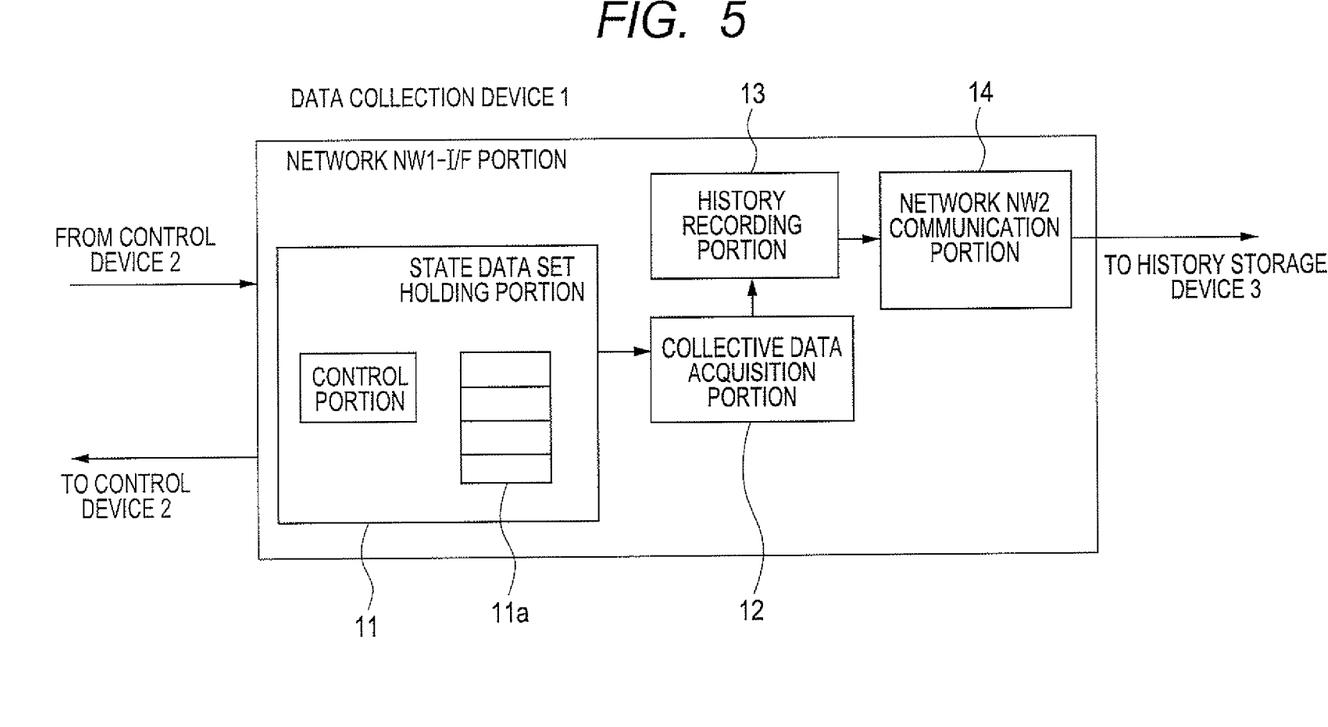
FIG. 5 is a diagram showing the configuration of the data collection device.

FIG. 5 is a functional block diagram of the data collection device 1.

The data collection device 1 includes a network NW1-interface portion 11 that transmits and receives the state data set between itself and the adjacent control device 2. The network NW1-interface portion 11 includes a state data set holding portion 11*a*. The state data set received from the adjacent control device 2 at the predetermined reception period is held and updated in the state data set holding portion 11*a*, and the state data set held therein is transmitted at the predetermined transmission period.

The data collection device 1 includes a collective data acquisition portion 12 that acquires the state data set from the state data set holding portion of the network NW1-interface portion 11 at a predetermined collective data acquisition period (for example, 100 milliseconds). Time information when the state data set is acquired is added by a history recording portion 13 to the state data set acquired by the collective data acquisition portion 12, and they are transmitted to a history storage device 3 each time the state data set is acquired or the state data set is acquired several times. The history of the state data is stored in this way, and it is possible to monitor the operation of a device or the like over a plurality of modules. For example, the data collection device 1 is configured by providing a network interface in a common computer.

In the present embodiment, for example, even when one of the devices on the network is congested, the overall delay of the data transmission time is only the delay of processing performed by such a device. Since it is extremely rare that all the control devices 2 and the data collection device 1 are congested simultaneously, it is also extremely rare that the overall transmission time of the state data is significantly fluctuated, and thus the data collection is highly reliable.

However, when a polling method in which the data is sequentially collected from the control devices 2 is employed, if, in the data collection device, for example, the history storage processing is congested, all the operations of the collection from the control devices are delayed. Hence, since an overall difference between the time of collecting data from the first control device and the time of collecting data from the last control device is a total of all delays, such a collection time difference is significantly large and exceeds an allowance range, and the reliability of the data collection is insufficient.

Although the loop connection is described above, the connection is not limited to the loop connection; a chain connection in which the data collection device and any of the control devices are ends thereof may be employed. In this case, for example, a configuration in which the state data is transmitted to the data collection device through the control devices from the control device at one end is employed.

Since, in the present embodiment, an unillustrated loop is provided to form a double loop, even if a failure occurs in one of the loops, the loop is switched to the other loop. Hence, although, as described above, the state data of all the control devices is included in the state data set and thus new data can be restored at the time of occurrence of a failure, the state data of all the control devices is not necessarily needed to be included in the state data set. In other words, as long as the control device on the downstream side closer to the data collection device can receive the state data of all the control devices on the upstream side, it is not necessary for all the control devices to receive the state data of all the control devices.

The invention claimed is:

1. A vacuum processing apparatus comprising:
    a transfer module that transfers an object to be processed;
    a transfer module control device that repeatedly acquires state data of the transfer module at first intervals and stores the acquired state data of the transfer module therein;
    a process module that is connected to the transfer module and performs processing on the object to be processed which is transferred from the transfer module;

a process module control device that repeatedly acquires state data of the process module at second intervals and stores the acquired state data of the process module therein; and a data collection device that collects the state data of the transfer module and the state data of the process module, wherein the transfer module control device, the process module control device and the data collection device are connected in a loop and are configured such that a state data set including the state data of the transfer module and the state data of the process module can be transmitted and received between each other, wherein the data collection device is configured to receive the state data set from one of the transfer module control device and the process module control device and transmit the received state data set to the other one of the transfer module control device and the process module control device, and where the other one of the transfer module control device and the process module control device is configured to receive the state data set from the data collection device to replace, in response to timing of reception of the state data set, only its own state data portion in the received state data set with the latest state data stored therein to create an updated state data set including the latest state data and the state data of the one of the transfer module control device and the process module control device in the received state data set as it is, and to transmit the updated state data set to the one of the transfer module control device and the process module control device.

2. The vacuum processing apparatus of claim 1, wherein a transmission period of the state data set of each of the data collection device, process module control device and the transfer module control device is set such that an arrival time until the state data portion updated in the process module control device and the transfer module control device arrives at the data collection device is less than twice a data collection interval in the process module control device and the transfer module control device.

3. The vacuum processing apparatus of claim 1, wherein the process module control device and the transfer module control device are configured such that processing for acquiring their respective state data and processing for transmitting their respective data including their respective state data can be performed concurrently.

4. The vacuum processing apparatus of claim 1, further comprising a history storage device that stores a history of state data acquired by the data collection device.

5. The vacuum processing apparatus of claim 1, wherein the transfer module comprises:
   a first sub-module that supplies, by a transfer robot, the object to be processed to the process module; and
   a second sub-module that supplies the object to be processed to the transfer robot, and wherein
   the transfer module control device is provided commonly for both the first and second sub-modules.

6. The vacuum processing apparatus of claim 1, wherein the one of the transfer module control device an the process module control device is configured to receive the state data set from the other one of the transfer module control device and the process module control device, to replace, in response to timing of reception of the state data set, only its own state data in the received data set with the latest state data stored therein to create an updated state data set including the latest state data and the state data of the other one of the transfer module control device and the process module control device in the received state data set as it is, and to transmit the updated state data set to the data collection device.

* * * * *